United States Patent
Oak

(10) Patent No.: US 12,431,882 B2
(45) Date of Patent: Sep. 30, 2025

(54) CIRCUIT FOR SENSING AND AMPLIFYING SIGNAL OF SIGNAL LINE

(71) Applicant: SK hynix Inc., Icheon-si (KR)

(72) Inventor: Seung Han Oak, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 232 days.

(21) Appl. No.: 18/329,083

(22) Filed: Jun. 5, 2023

(65) Prior Publication Data

US 2024/0313755 A1   Sep. 19, 2024

(30) Foreign Application Priority Data

Mar. 16, 2023   (KR) .................... 10-2023-0034811

(51) Int. Cl.
    H03K 5/24       (2006.01)
    H03F 3/45       (2006.01)
    H03K 19/0185    (2006.01)

(52) U.S. Cl.
    CPC ....... *H03K 5/2481* (2013.01); *H03F 3/45273* (2013.01); *H03F 3/45475* (2013.01); *H03K 19/018514* (2013.01)

(58) Field of Classification Search
    CPC ......... H03K 5/2481; H03K 19/018514; H03F 3/45273; H03F 3/45475; G11C 29/021; G11C 29/028; G11C 29/026; G11C 7/06; G11C 16/12; G11C 16/04; G11C 16/34; G11C 7/062; G11C 5/147
    See application file for complete search history.

(56) References Cited

U.S. PATENT DOCUMENTS

| | | | | |
|---|---|---|---|---|
| 6,157,222 A | * | 12/2000 | Yaklin | H03K 17/302 327/68 |
| 9,754,640 B1 | * | 9/2017 | Yang | G11C 13/0026 |
| 2011/0235450 A1 | | 9/2011 | Lee et al. | |
| 2016/0141028 A1 | * | 5/2016 | Guo | G11C 7/14 365/163 |
| 2017/0235423 A1 | * | 8/2017 | Hwang | G05F 3/262 345/174 |
| 2023/0282278 A1 | * | 9/2023 | Yuh | G11C 13/0069 365/148 |

FOREIGN PATENT DOCUMENTS

KR    1020010092224 A    10/2001

* cited by examiner

*Primary Examiner* — Metasebia T Retebo
(74) *Attorney, Agent, or Firm* — WILLIAM PARK AND ASSOCIATES LTD.

(57) ABSTRACT

A circuit for sensing and amplifying a signal of a signal line includes a sensing voltage generation circuit including a sensing circuit, the sensing voltage generation circuit configured to generate a sensing voltage by sensing and amplifying a line input signal based on a bias voltage, and a bias voltage generation circuit including a replication circuit, the replication circuit having a structure identical to a structure of the sensing circuit and generating a replication voltage and the bias voltage generation circuit configured to generate the bias voltage by comparing the replication voltage with a logic threshold level.

18 Claims, 7 Drawing Sheets

FIG.2

CIRCUIT FOR SENSING AND AMPLIFYING SIGNAL OF SIGNAL LINE

CROSS-REFERENCE TO RELATED APPLICATION

The present application claims priority under 35 U.S.C. § 119(a) to Korean application number 10-2023-0034811, filed in the Korean Intellectual Property Office on Mar. 16, 2023, the entire disclosure of which is incorporated herein by reference.

BACKGROUND

The present disclosure relates to a circuit for sensing and amplifying a signal of a signal line.

In general, various electronic devices including a mobile device include multiple signal lines through which signals are internally transmitted. The electronic device includes a circuit for sensing and amplifying a signal of a signal line in order to sense and amplify a signal when a signal of one signal line is transferred to another signal line.

SUMMARY

In an embodiment, a circuit for sensing and amplifying a signal of a signal line may include a sensing voltage generation circuit including a sensing circuit, the sensing voltage generation circuit configured to generate a sensing voltage by sensing and amplifying a line input signal based on a bias voltage, and a bias voltage generation circuit including a replication circuit, the replication circuit having a structure identical to a structure of the sensing circuit and generating a replication voltage and the bias voltage generation circuit configured to generate the bias voltage by comparing the replication voltage with a logic threshold level.

Furthermore, in an embodiment, a circuit for sensing and amplifying a signal of a signal line may include a sensing circuit configured to sense and amplify a line input signal based on a bias voltage and configured to set a voltage of a first node by comparing an amount of current that flows through an input node to which the line input signal is input with an amount of current that flows through the first node, a driving circuit configured to drive a sensing voltage based on the voltage of the first node, a replication circuit configured to have a structure identical to a structure of the sensing circuit and configured to generate a replication voltage, a comparator configured to generate the bias voltage by comparing the sensing voltage with a logic threshold voltage, and a line output signal driving circuit configured to drive a line output signal based on the sensing voltage.

BRIEF DESCRIPTION OF THE DRAWINGS

FIG. 2 is a circuit diagram according to an example of a sensing voltage generation circuit that is included in the circuit for sensing and amplifying a signal of a signal line, which is illustrated in FIG. 1.

DETAILED DESCRIPTION

In the descriptions of the following embodiments, the term "preset" indicates that the numerical value of a parameter is previously decided, when the parameter is used in a process or algorithm. According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. In contrast, when one component is referred to as being "directly coupled" or "directly connected" to another component, it should be understood that the components are directly coupled or connected to each other without another component interposed therebetween.

A "logic high level" and a "logic low level" are used to describe the logic levels of signals. A signal having a "logic high level" is distinguished from a signal having a "logic low level." For example, when a signal having a first voltage corresponds to a signal having a "logic high level," a signal having a second voltage may correspond to a signal having a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level in some embodiments, and a signal having a logic low level may be set to have a logic high level in some embodiments.

A "logic bit set" may mean a combination of logic levels of bits included in a signal. When a logic level of each of the bits included in the signal is changed, a logic bit set of the signal may be differently set. For example, if two bits are included in a signal, a logic bit set of the signal may be set as a first logic bit set when logic levels of the two bits included in the signal are a "logic low level" and a "logic low level", and may be set as a second logic bit set when logic levels of the two bits included in the signal are a "logic low level", and a "logic high level."

Hereafter, the present disclosure will be described in more detail through embodiments. The embodiments are only used to exemplify the present disclosure, and the scope of the present disclosure is not limited by the embodiments.

Figure 1:
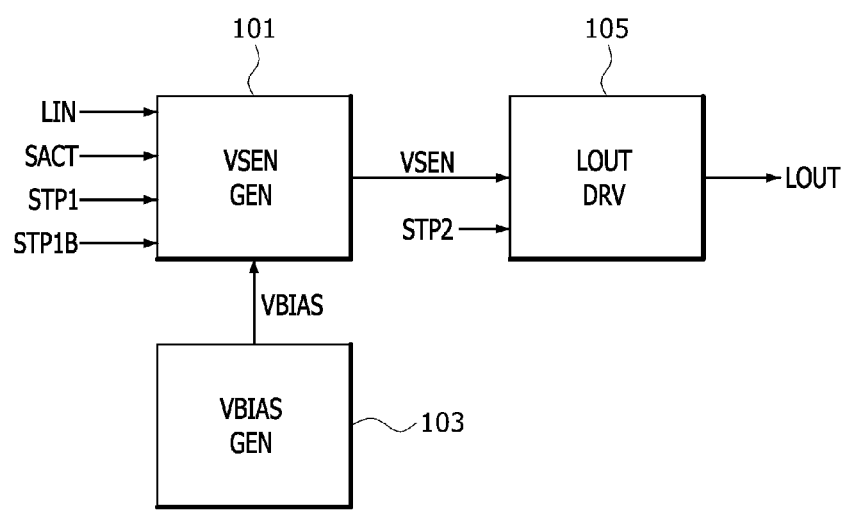
FIG. 1 is a block diagram illustrating a structure of a circuit for sensing and amplifying a signal of a signal line according to an example of the present disclosure.

FIG. 1 is a block diagram illustrating a structure of a circuit 10 for sensing and amplifying a signal of a signal line according to an example of the present disclosure. As illustrated in FIG. 1, the circuit 10 for sensing and amplifying a signal of a signal line may include a sensing voltage generation circuit (VSEN GEN) 101, a bias voltage generation circuit (VBIAS GEN) 103, and a line output signal driving circuit (LOUT DRV) 105.

The sensing voltage generation circuit 101 may receive a bias voltage VBIAS from the bias voltage generation circuit 103. Based on a sensing activation signal SACT, a first strobing pulse STP1, a first inverted strobing pulse STP1B, and the bias voltage VBIAS, the sensing voltage generation circuit 101 may generate a sensing voltage VSEN by sensing and amplifying a line input signal LIN. The sensing activation signal SACT may be generated in order for the line input signal LIN to be input to the sensing voltage generation circuit 101. The first strobing pulse STP1 may be generated for an operation that senses and amplifies the line input signal LIN after the sensing activation signal SACT is generated. The first inverted strobing pulse STP1B may be generated by inverting the first strobing pulse STP1. The sensing voltage generation circuit 101 may receive the line input signal LIN when the sensing activation signal SACT is generated. The sensing voltage generation circuit 101 may perform a sensing and amplification operation that senses and amplifies the line input signal LIN that is input when the first strobing pulse STP1 is generated and may drive the sensing voltage VSEN. The level of the voltage of an input node (nd112 in FIG. 2) of a sensing circuit (123 in FIG. 2) that is included in the sensing voltage generation circuit 101 may be set as a logic threshold level based on the bias voltage VBIAS. The logic threshold level may mean a voltage level that corresponds to a boundary between a logic high level and a logic low level. Since the level of the voltage of the input node (nd112 in FIG. 2) of the sensing circuit (123 in FIG. 2) is set as the logic threshold level, a difference between the amount of current that flows through the input node (nd112 in FIG. 2) of the sensing circuit (123 in FIG. 2), which is set by the line input signal LIN when the line input signal LIN is input, and the amount of current that flows through an output node (nd116 in FIG. 2) can be rapidly sensed and amplified.

The bias voltage generation circuit 103 may generate the bias voltage VBIAS that is applied to the sensing voltage generation circuit 101. The bias voltage generation circuit 103 may include a replication circuit (151 in FIG. 3) that generates a replication voltage (VREP in FIG. 3). The replication circuit 151 may have the same structure as the sensing circuit (123 in FIG. 2) that is included in the sensing voltage generation circuit 101. The bias voltage generation circuit 103 may generate the bias voltage VBIAS by comparing the replication voltage (VREP in FIG. 3) with a logic threshold level. The bias voltage generation circuit 103 may set the level of the voltage of the input node (nd112 in FIG. 2) of the sensing circuit (123 in FIG. 2) as the logic threshold level by generating the bias voltage VBIAS that enables the level of the replication voltage (VREP in FIG. 3) to be set as the logic threshold level.

The line output signal driving circuit 105 may receive the sensing voltage VSEN from the sensing voltage generation circuit 101 and may receive a second strobing pulse STP2. After the sensing activation signal SACT and the first strobing pulse STP1 are generated and an operation that senses and amplifies the line input signal LIN is performed in response to the first strobing pulse STP1, the second strobing pulse STP2 may be generated. The sensing activation signal SACT, the first strobing pulse STP1, the first inverted strobing pulse STP1B, and the second strobing pulse STP2 may be sequentially generated by a control circuit (not illustrated) that controls an operation of the circuit 10 that senses and amplifies a signal of a signal line. The line output signal driving circuit 105 may drive a line output signal LOUT based on the second strobing pulse STP2 and the sensing activation signal SACT.

Figure 2:
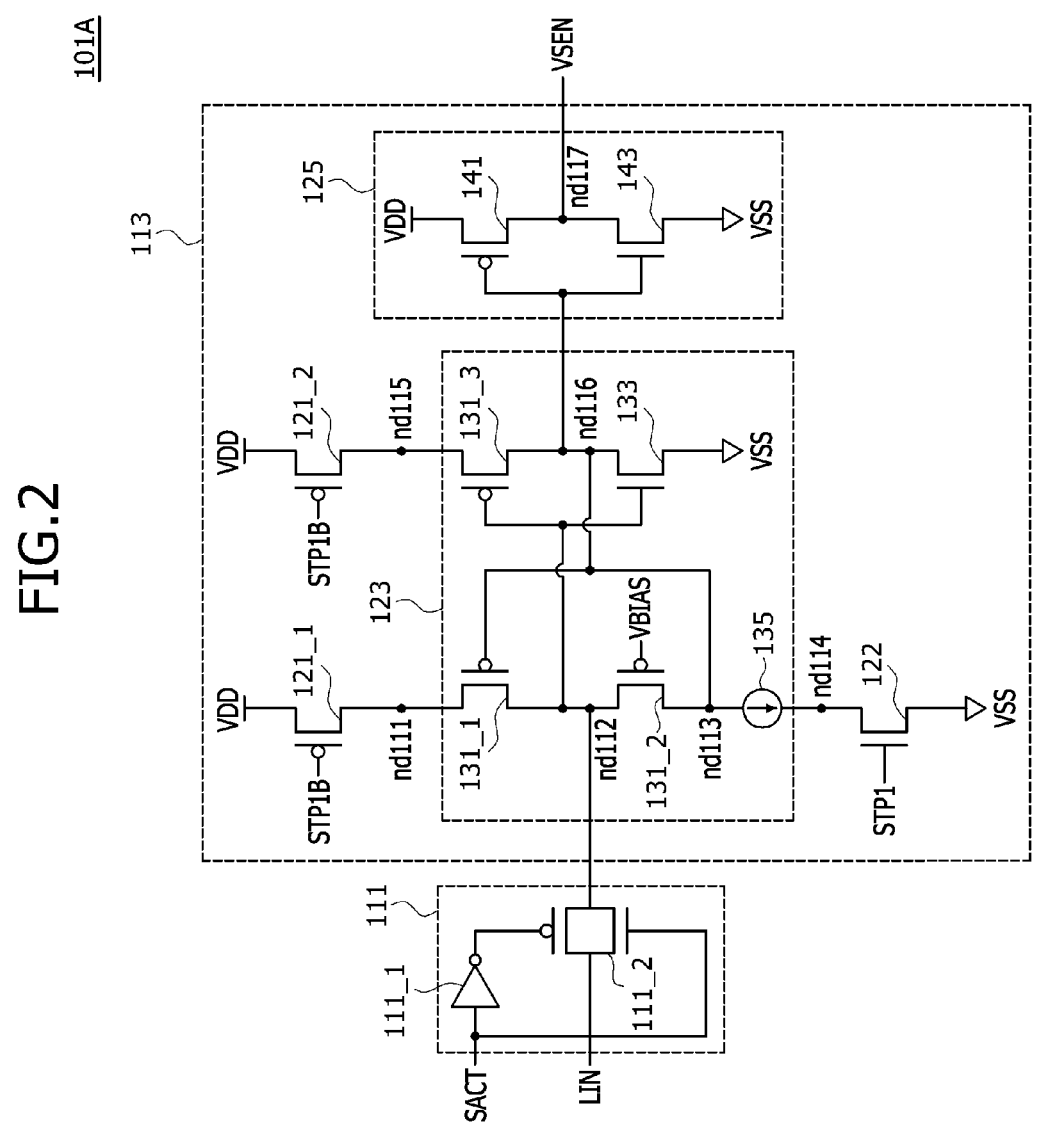
Figure 3:
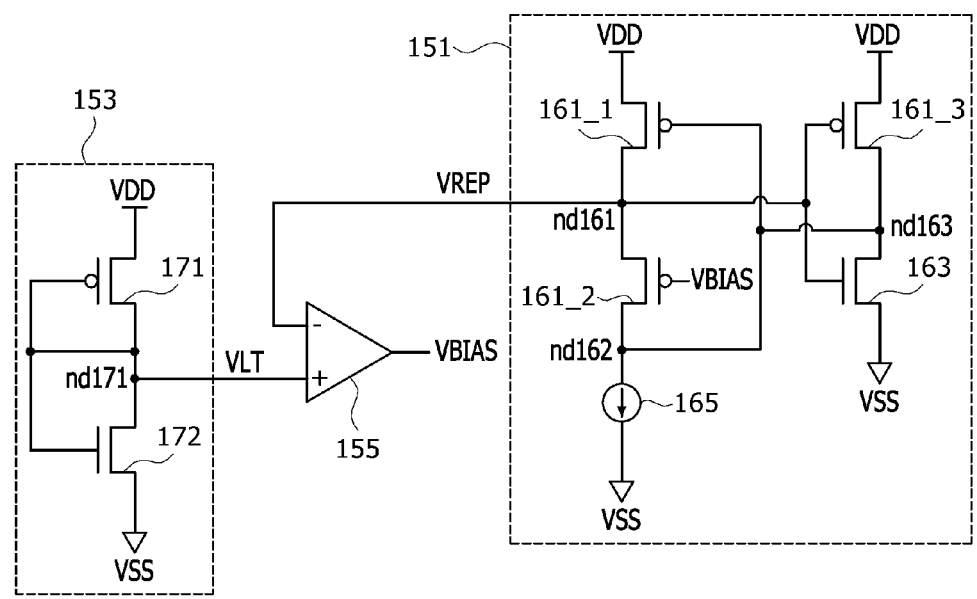
FIG. 3 is a circuit diagram according to an example of a bias voltage generation circuit that is included in the circuit for sensing and amplifying a signal of a signal line, which is illustrated in FIG. 1.

In the aforementioned description of FIG. 1, the components that are included in the circuit 10 that senses and amplifies a signal of a signal line have been described based on a sensing voltage generation circuit 101A, illustrated in FIG. 2, and a bias voltage generation circuit 103A, illustrated in FIG. 3. However, this is merely an embodiment and the present disclosure might not be limited thereto. That is, the circuit 10 that senses and amplifies a signal of a signal line according to another embodiment of the present disclosure may be implemented as a modified embodiment including a sensing circuit capable of sensing and amplifying a signal of a signal line by using a bias voltage that is generated by a replication circuit.

FIG. 2 is a circuit diagram of the sensing voltage generation circuit 101A according to an example of the sensing voltage generation circuit 101. As illustrated in FIG. 2, the sensing voltage generation circuit 101A may include an input circuit 111 and a sensing driving circuit 113.

The input circuit 111 may include an inverter 111_1 and a transfer gate 111_2. The inverter 111_1 may invert and buffer the sensing activation signal SACT. The transfer gate 111_2 may transfer the line input signal LIN to the node nd112 when the level of the sensing activation signal SACT is generated as a logic high level. The input circuit 111 may transfer the line input signal LIN to the node nd112 when the level of the sensing activation signal SACT is generated as a logic high level.

The sensing driving circuit 113 may include PMOS transistors 121_1 and 121_2, an NMOS transistor 122, the sensing circuit 123, and a driving circuit 125.

The PMOS transistor 121_1 may be connected between a terminal for a source voltage VDD and a node nd111 and may be turned on based on the first inverted strobing pulse STP1B. The PMOS transistor 121_2 may be connected between the terminal for the source voltage VDD and a node nd115 and may be turned on based on the first inverted strobing pulse STP1B. Each of the PMOS transistors 121_1 and 121_2 may be turned on when the level of the first inverted strobing pulse STP1B is generated as a logic low level. The NMOS transistor 122 may be connected between a node nd114 and a terminal for a ground voltage VSS and may be turned on based on the first strobing pulse STP1. The NMOS transistor 122 may be turned on when the level of the first strobing pulse STP1 is generated as a logic high level. The sensing circuit 123 may perform a sensing and amplification operation when all of the PMOS transistors 121_1 and 121_2 and the NMOS transistor 122 are turned on. Accordingly, the PMOS transistors 121_1 and 121_2 and the NMOS transistor 122 may operate as sensing activation elements.

The sensing circuit 123 may include PMOS transistors 131_1, 131_2, and 131_3, an NMOS transistor 133, and a constant current source 135. The PMOS transistor 131_1 may be connected between the node nd111 and the node nd112 and may be turned on based on the voltage of the node nd116. The PMOS transistor 131_2 may be connected between the node nd112 and a node nd113 and may be turned on based on the bias voltage VBIAS. The PMOS transistor 131_3 may be connected between the node nd115 and the node nd116 and may be turned on based on the voltage of the node nd112. The NMOS transistor 133 may be connected between the node nd116 and the terminal for the ground voltage VSS and may be turned on based on the voltage of the node nd112. The constant current source 135 may be connected between the node nd113 and the node nd114. The sensing circuit 123 may set the voltage level of the node nd116 by comparing the amount of current that flows through the node nd112 when the line input signal LIN is input through the node nd112 with the amount of current that flows through the node nd116. Since the level of the voltage of the node nd112 is set as a logic threshold level by the bias voltage VBIAS, the sensing circuit 123 can rapidly sense and amplify the line input signal LIN that is input through the node nd112.

The driving circuit 125 may include a PMOS transistor 141 and an NMOS transistor 143. The PMOS transistor 141 may be connected between the terminal for the source voltage VDD and a node nd117 from which the sensing voltage VSEN is output and may be turned on based on the voltage of the node nd116. The NMOS transistor 143 may be connected between the node nd117 and the terminal for the ground voltage VSS and may be turned on based on the voltage of the node nd116. The driving circuit 125 may drive the sensing voltage VSEN based on the voltage of the node nd112, the voltage level of which is set based on the results of a sensing and amplification operation for the line input signal LIN in the sensing circuit 123.

FIG. 3 is a circuit diagram of the bias voltage generation circuit 103A according to an example of the bias voltage generation circuit 103. As illustrated in FIG. 3, the bias voltage generation circuit 103A may include the replication circuit 151, a logic threshold voltage generation circuit 153, and a comparator 155.

The replication circuit 151 may have the same structure as the sensing circuit 123 and may generate the replication voltage VREP through a node nd161 corresponding to the input node nd112 of the sensing circuit 123. The replication circuit 151 may include PMOS transistors 161_1, 161_2, and 161_3, an NMOS transistor 163, and a constant current source 165. The PMOS transistor 161_1 may be connected between the terminal for the source voltage VDD and the node nd161 and may be turned on based on the voltage of a node nd163. The PMOS transistor 161_2 may be connected between the node nd161 and a node nd162 and may be turned on based on the bias voltage VBIAS. The PMOS transistor 161_3 may be connected between the terminal for the source voltage VDD and the node nd163 and may be turned on based on the voltage of the node nd161 from which the replication voltage VREP is output. The NMOS transistor 133 may be connected between the node nd163 and the terminal for the ground voltage VSS and may be turned on based on the voltage of the node nd161. The constant current source 165 may be connected between the node nd162 and the terminal for the ground voltage VSS.

The logic threshold voltage generation circuit 153 may generate a logic threshold voltage VLT having a logic threshold level. The logic threshold voltage generation circuit 153 may include a PMOS transistor 171 and an NMOS transistor 172. The PMOS transistor 171 may be connected between the terminal for the source voltage VDD and a node nd171 and may be turned on based on the voltage of the node nd171. The NMOS transistor 172 may be connected between the node nd171 and the terminal for the ground voltage VSS and may be turned on based on the voltage of the node nd171.

The comparator 155 may receive the replication voltage VREP from the replication circuit 151 and may receive the logic threshold voltage VLT from the logic threshold voltage generation circuit 153. The comparator 155 may generate the bias voltage VBIAS based on the replication voltage VREP and the logic threshold voltage VLT. The comparator 155 may generate the bias voltage VBIAS capable of setting the level of the replication voltage VREP as a logic threshold level based on a result of a comparison between the replication voltage VREP and the logic threshold voltage VLT.

Figure 4:
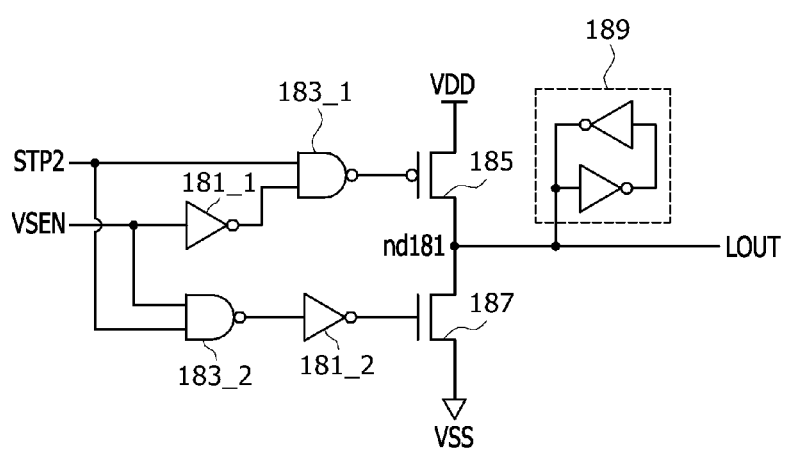
FIG. 4 is a circuit diagram according to an example of a line output signal driving circuit that is included in the circuit for sensing and amplifying a signal of a signal line, which is illustrated in FIG. 1.

FIG. 4 is a circuit diagram of a line output signal driving circuit 105A according to an example of the line output signal driving circuit 105.

As illustrated in FIG. 4, the line output signal driving circuit 105A may include inverters 181_1 and 181_2, NAND gates 183_1 and 183_2, a PMOS transistor 185, an NMOS transistor 187, and a latch 189. The inverter 181_1 may invert and buffer the sensing voltage VSEN. The NAND gate 183_1 may perform a NAND operation by receiving the output signal of the inverter 181_1 and the second strobing pulse STP2. The NAND gate 183_2 may perform a NAND operation by receiving the sensing voltage VSEN and the second strobing pulse STP2. The inverter 181_2 may invert and buffer the output signal of the NAND gate 183_2. The PMOS transistor 185 may be connected between the terminal for the source voltage VDD and the node nd181 and may be turned on based on the output signal of the NAND gate 183_1. The NMOS transistor 187 may be connected between the node nd181 and the terminal for the ground voltage VSS and may be turned on based on the output signal of the inverter 181_2. The latch 189 may latch a line output signal LOUT that is output from the node nd181.

Figure 5:
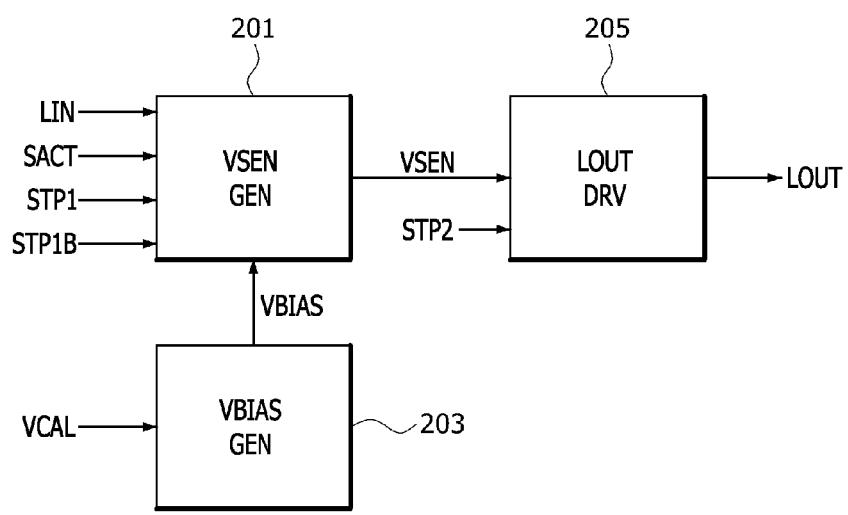
FIG. 5 is a block diagram illustrating a structure of a circuit for sensing and amplifying a signal of a signal line according to another example of the present disclosure.

FIG. 5 is a block diagram illustrating a structure of a circuit 20 for sensing and amplifying a signal of a signal line according to another example of the present disclosure. As illustrated in FIG. 5, the circuit 20 for sensing and amplifying a signal of a signal line may include a sensing voltage generation circuit (VSEN GEN) 201, a bias voltage generation circuit (VBIAS GEN) 203, and a line output signal driving circuit (LOUT DRV) 205.

The sensing voltage generation circuit 201 may receive a bias voltage VBIAS from the bias voltage generation circuit 203. Based on a sensing activation signal SACT, a first strobing pulse STP1, a first inverted strobing pulse STP1B, and the bias voltage VBIAS, the sensing voltage generation circuit 201 may generate a sensing voltage VSEN by sensing and amplifying a line input signal LIN. The sensing voltage generation circuit 201 may receive the line input signal LIN when the sensing activation signal SACT is generated. The sensing voltage generation circuit 201 may perform a sensing and amplification operation that senses and amplifies the line input signal LIN that is input when the first strobing pulse STP1 is generated and may drive a sensing voltage VSEN. The sensing voltage generation circuit 201 may be implemented in a similar manner as the sensing voltage generation circuit 101, illustrated in FIG. 1, and the sensing voltage generation circuit 101A, illustrated in FIG. 2, and thus, descriptions of a detailed construction and operation of the sensing voltage generation circuit 201 have been omitted.

The bias voltage generation circuit 203 may generate the bias voltage VBIAS that is applied to the sensing voltage generation circuit 201. The bias voltage generation circuit 203 may include a replication circuit (211 in FIG. 6) that has the same structure as the sensing circuit 123 included in the sensing voltage generation circuit 101 and that generates a replication voltage VREP. The bias voltage generation circuit 203 may generate the bias voltage VBIAS by comparing the replication voltage VREP with a logic threshold level. The bias voltage generation circuit 203 may calibrate the voltage level of the replication voltage VREP based on a calibration voltage VCAL.

The line output signal driving circuit 205 may receive the sensing voltage VSEN from the sensing voltage generation circuit 201 and may receive a second strobing pulse STP2. The line output signal driving circuit 205 may drive a line output signal LOUT based on the second strobing pulse STP2 and the sensing activation signal SACT. The line output signal driving circuit 205 may be implemented in a similar manner as the line output signal driving circuit 105, illustrated in FIG. 1, and the line output signal driving circuit 105A, illustrated in FIG. 4, and thus, descriptions of a detailed construction and operation of the line output signal driving circuit 205 have been omitted.

Figure 6:
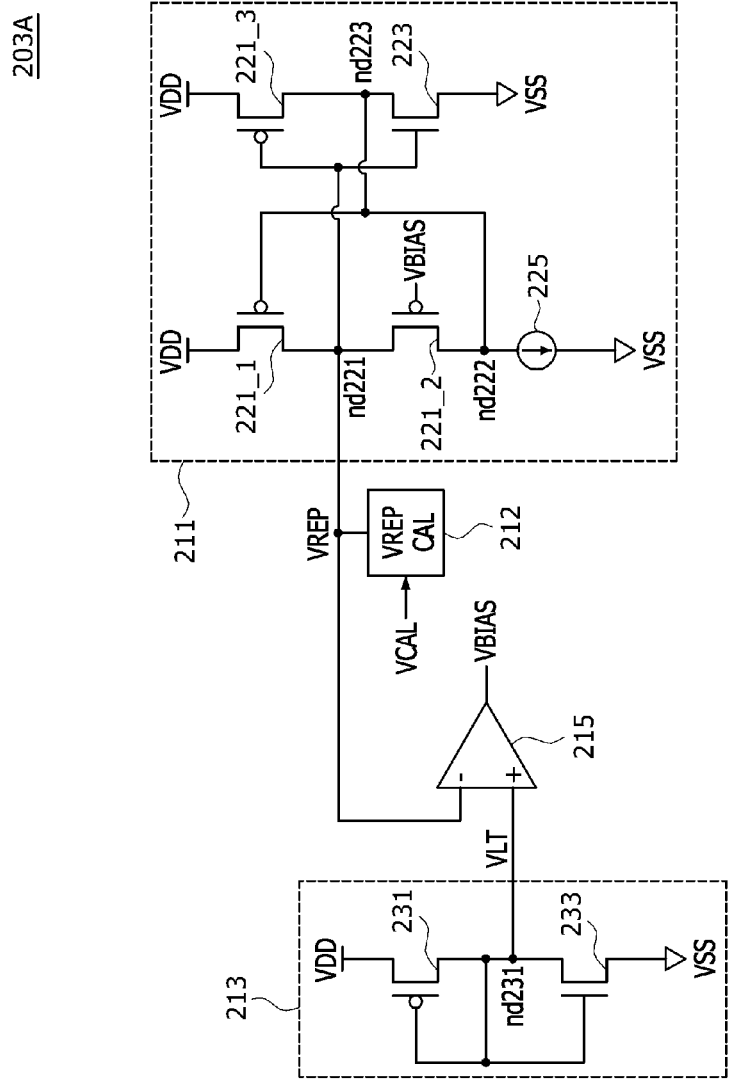
FIG. 6 is a diagram according to an example of a bias voltage generation circuit that is included in the circuit for sensing and amplifying a signal of a signal line, which is illustrated in FIG. 5.

FIG. 6 is a diagram illustrating a construction of a bias voltage generation circuit 203A according to an example of the bias voltage generation circuit 203. As illustrated in FIG. 6, the bias voltage generation circuit 203A may include the replication circuit 211, a replication voltage calibration circuit (VREP CAL) 212, a logic threshold voltage generation circuit 213, and a comparator 215.

The replication circuit 211 may include PMOS transistors 221_1, 221_2, and 221_3, an NMOS transistor 223, and a constant current source 225. The PMOS transistor 221_1 may be connected between a terminal for the source voltage VDD and a node nd221 and may be turned on based on the voltage of a node nd223. The PMOS transistor 221_2 may be connected between the node nd221 and a node nd222 and may be turned on based on the bias voltage VBIAS. The PMOS transistor 221_3 may be connected between the terminal for the source voltage VDD and the node nd223 and may be turned on based on the voltage of the node nd221 from which the replication voltage VREP is output. The NMOS transistor 223 may be connected between the node nd223 and a terminal for a ground voltage VSS and may be turned on based on the voltage of the node nd221. The constant current source 225 may be connected between the node nd222 and the terminal for the ground voltage VSS.

Based on the calibration voltage VCAL, the replication voltage calibration circuit 212 can calibrate the voltage level of the replication voltage VREP by calibrating the amount of current that is discharged from the node nd221 from which the replication voltage VREP is output. For example, the voltage level of the replication voltage VREP may be calibrated to be low because the amount of current discharged from the node nd221 is increased as the voltage level of the calibration voltage VCAL is increased. The calibration voltage VCAL may be implemented to be applied by a test device (not illustrated) or a controller (not illustrated), outside of an electronic device (not illustrated) in which the circuit 10 for sensing and amplifying a signal of a signal line is used, or may be implemented to be generated in accordance with an internal control operation within an electronic device.

The logic threshold voltage generation circuit 213 may generate a logic threshold voltage VLT having a logic threshold level. The logic threshold voltage generation circuit 213 may include a PMOS transistor 231 and an NMOS transistor 233. The PMOS transistor 231 may be connected between the terminal for the source voltage VDD and a node nd231 and may be turned on based on the voltage of the node nd231. The NMOS transistor 233 may be connected between the node nd231 and the terminal for the ground voltage VSS and may be turned on based on the voltage of the node nd231.

The comparator 215 may receive the replication voltage VREP from the replication circuit 211 and may receive the logic threshold voltage VLT from the logic threshold voltage generation circuit 213. The comparator 215 may generate the bias voltage VBIAS based on the replication voltage VREP and the logic threshold voltage VLT. Based on a result of a comparison between the replication voltage VREP and the logic threshold voltage VLT, the comparator 215 may generate the bias voltage VBIAS that is capable of setting the level of the replication voltage VREP as a logic threshold level.

Figure 7:
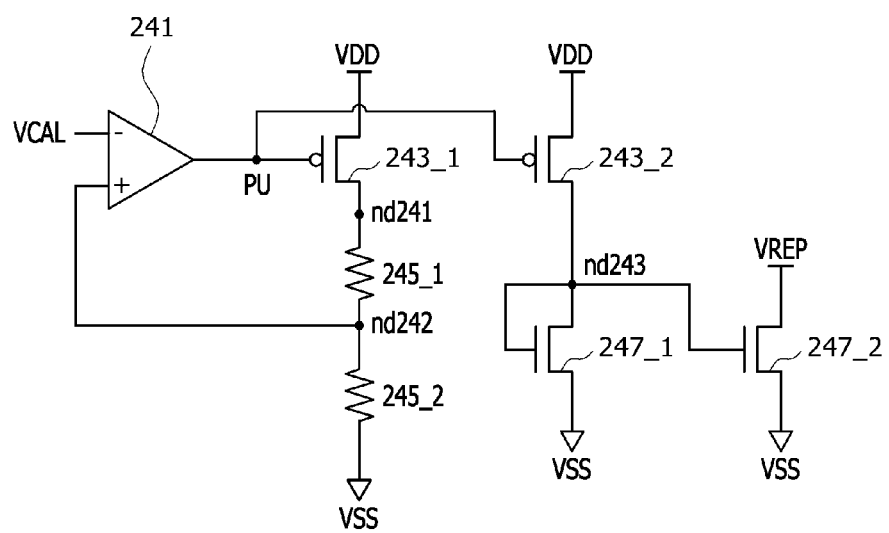
FIG. 7 is a circuit diagram according to an example of a replication pulse calibration circuit that is included in the bias voltage generation circuit illustrated in FIG. 6.

FIG. 7 is a circuit diagram of a replication voltage calibration circuit 212A according to an example of the replication voltage calibration circuit 212. As illustrated in FIG. 7, the replication voltage calibration circuit 212A may include a pull-up signal generation circuit 241, PMOS transistors 243_1 and 243_2, resistor elements 245_1 and 245_2, and NMOS transistors 247_1 and 247_2. The resistor elements 245_1 and 245_2 may be connected in series between a node nd241 and the terminal for the ground voltage VSS and may output the voltage of the node nd241 through a node nd242 by dividing the voltage of the node nd241. The pull-up signal generation circuit 241 may generate a pull-up signal PU by comparing the voltage of the node nd242 with the calibration voltage VCAL. The PMOS transistor 243_1 may be connected between the terminal for the source voltage VDD and the node nd241 and may be turned on based on the pull-up signal PU. The PMOS transistor 243_2 may be connected between the terminal for the source voltage VDD and a node nd243 and may be turned on based on the pull-up signal PU. The NMOS transistor 247_1 may be connected between the node nd243 and the terminal for the ground voltage VSS and may be turned on based on the voltage of the node nd243. The NMOS transistor 247_2 may be connected between the replication voltage VREP and the terminal for the ground voltage VSS and may be turned on based on the voltage of the node nd243. The replication voltage calibration circuit 212A can drive the replication voltage VREP to a low voltage level because the voltage of the node nd243 is driven to a high voltage level by the PMOS transistor 243_2 as the voltage level of the calibration voltage VCAL is set to be high. The replication voltage calibration circuit 212A may calibrate the voltage level of the replication voltage VREP based on the calibration voltage VCAL. The sensing and amplification speed of the sensing voltage generation circuit 201 to which the bias voltage VBIAS, the voltage level of which is set based on the voltage level of the replication voltage VREP that is applied, can be calibrated.

The embodiments of the present disclosure have been described so far. A person having ordinary knowledge in the art to which the present invention pertains will understand that the present invention may be implemented in a modified form without departing from an intrinsic characteristic of the present disclosure. Accordingly, the disclosed embodiments should be considered from a descriptive viewpoint, not from a limitative viewpoint. The range of the present disclosure is described in the claims not the aforementioned description, and all differences within an equivalent range thereof should be construed as being included in the present disclosure.

What is claimed is:

1. A circuit for sensing and amplifying a signal of a signal line, the circuit comprising:

a sensing voltage generation circuit comprising a sensing circuit, the sensing voltage generation circuit configured to generate a sensing voltage by sensing and amplifying a line input signal based on a bias voltage; and a bias voltage generation circuit comprising a replication circuit, the replication circuit having a structure identical to a structure of the sensing circuit and generating a replication voltage and the bias voltage generation circuit configured to generate the bias voltage by comparing the replication voltage with a logic threshold level, wherein, after a sensing activation signal is generated, the sensing voltage generation circuit is configured to receive a first strobing pulse that is generated for a sensing and amplification operation of the sensing circuit.

2. The circuit of claim 1, wherein the sensing circuit is configured to receive the bias voltage for setting a level of a voltage of an input node to which the line input signal is input as the logic threshold level.

3. The circuit of claim 1, wherein the sensing circuit is configured to set a voltage of a first node by comparing an amount of current that flows through an input node to which the line input signal is input with an amount of current that flows through the first node.

4. The circuit of claim 3, wherein the sensing circuit comprises:
- a first PMOS transistor that is connected between a second node and the input node and that is turned on based on the voltage of the first node;
- a second PMOS transistor that is connected between the input node and a third node and that is turned on based on the bias voltage;
- a third PMOS transistor that is connected between a fourth node and the first node and that is turned on based on a voltage of the input node;
- an NMOS transistor that is connected between the first node and a terminal for a ground voltage and that is turned on based on the voltage of the input node; and
- a constant current source that is connected to the third node.

5. The circuit of claim 1, wherein the sensing voltage generation circuit further comprises an input circuit configured to transfer the line input signal to an input node of the sensing circuit when a sensing activation signal is generated.

6. The circuit of claim 1, wherein the sensing voltage generation circuit further comprises a driving circuit configured to drive the sensing voltage based on a result of the sensing and amplification operation for the line input signal.

7. The circuit of claim 1, wherein the replication circuit comprises:
- a first PMOS transistor that is connected between a terminal for a source voltage and a first node from which the replication voltage is output and that is turned on based on a voltage of a second node;
- a second PMOS transistor that is connected between the first node and a third node and that is turned on based on the bias voltage;
- a third PMOS transistor that is connected between the terminal for the source voltage and the second node and that is turned on based on a voltage of the first node;
- an NMOS transistor that is connected between the second node and a terminal for a ground voltage and that is turned on based on a voltage of the first node; and
- a constant current source that is connected to the third node.

8. The circuit of claim 1, wherein the bias voltage generation circuit further comprises a logic threshold voltage generation circuit configured to generate a logic threshold voltage having the logic threshold level.

9. The circuit of claim 8, wherein the logic threshold voltage generation circuit comprises:
- a PMOS transistor that is connected between the terminal for the source voltage and a node and that is turned on based on a voltage of the node; and
- an NMOS transistor that is connected between the node and the terminal for the ground voltage and that is turned on based on the voltage of the node.

10. The circuit of claim 8, wherein the bias voltage generation circuit further comprises a comparator configured to generate the bias voltage by comparing the sensing voltage with the logic threshold voltage.

11. The circuit of claim 8, wherein the bias voltage generation circuit further comprises a replication voltage calibration circuit configured to calibrate the replication voltage based on a calibration voltage.

12. The circuit of claim 1, further comprising a line output signal driving circuit configured to receive a second strobing pulse that is generated after the sensing voltage is generated by the first strobing pulse.

13. The circuit of claim 12, wherein the line output signal driving circuit is configured to drive a line output signal based on the sensing voltage when the second strobing pulse is generated.

14. A circuit for sensing and amplifying a signal of a signal line, the circuit comprising:
- a sensing circuit configured to sense and amplify a line input signal based on a bias voltage and configured to set a voltage of a first node by comparing an amount of current that flows through an input node to which the line input signal is input with an amount of current that flows through the first node;
- a driving circuit configured to drive a sensing voltage based on the voltage of the first node;
- a replication circuit configured to have a structure identical to a structure of the sensing circuit and configured to generate a replication voltage;
- a comparator configured to generate the bias voltage by comparing the sensing voltage with a logic threshold voltage; and
- a line output signal driving circuit configured to drive a line output signal based on the sensing voltage, wherein, when the sensing activation signal is generated and a first strobing pulse is generated, the sensing circuit is configured to sense and amplify the line input signal.

15. The circuit of claim 14, wherein the sensing circuit is configured to receive the bias voltage for setting a level of a voltage of the input node as a logic threshold level.

16. The circuit of claim 14, wherein the sensing circuit is configured to receive the line input signal through the input node when a sensing activation signal is generated.

17. The circuit of claim 1, further comprising a line output signal driving circuit configured to, when the first strobing pulse is generated and a second strobing pulse is generated, drive a line output signal based on the sensing voltage.

18. The circuit of claim 14, further comprising a replication voltage calibration circuit configured to calibrate the replication voltage based on a calibration voltage.

* * * * *